United States Patent
Wang et al.

(10) Patent No.: US 11,910,522 B2
(45) Date of Patent: Feb. 20, 2024

(54) FLEXIBLE CIRCUIT BOARD, METHOD FOR MANUFACTURING FLEXIBLE CIRCUIT BOARD AND DISPLAY DEVICE

(71) Applicants: Beijing BOE Display Technology Co., Ltd., Beijing (CN); BOE Technology Group Co., Ltd., Beijing (CN)

(72) Inventors: Tingting Wang, Beijing (CN); Qi Wang, Beijing (CN); Yan Yan, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/523,495

(22) Filed: Nov. 10, 2021

(65) Prior Publication Data

US 2022/0272831 A1    Aug. 25, 2022

(30) Foreign Application Priority Data

Feb. 25, 2021    (CN) .......................... 202110222523.0

(51) Int. Cl.
*H05K 1/02* (2006.01)
*H05K 1/09* (2006.01)

(52) U.S. Cl.
CPC .......... *H05K 1/0213* (2013.01); *H05K 1/028* (2013.01); *H05K 1/09* (2013.01); *H05K 2201/10128* (2013.01)

(58) Field of Classification Search
CPC ........ H05K 1/02; H05K 1/0213; H05K 1/028; H05K 1/09; H05K 2201/10128
USPC .......................................................... 361/751
See application file for complete search history.

(56) References Cited

U.S. PATENT DOCUMENTS

2002/0051110 A1*  5/2002  Kim ................... H01L 27/1288
                                                          349/149
2021/0215773 A1*  7/2021  Tsuruta .................. G01R 31/66

\* cited by examiner

*Primary Examiner* — Tremesha S Willis
(74) *Attorney, Agent, or Firm* — IPro, PLLC (57) ABSTRACT

A flexible circuit board, a method for manufacturing the flexible circuit board, and a display device are provided. The flexible circuit board includes: a plurality of driving signal lines arranged with mutually insulate-gates, wherein the driving signal lines comprise at least two voltage signal lines arranged adjacent to each other; at least one isolation protecting line, the isolation protecting line being located between the two voltage signal lines arranged adjacent to each other.

14 Claims, 4 Drawing Sheets

FIG. 10

FLEXIBLE CIRCUIT BOARD, METHOD FOR MANUFACTURING FLEXIBLE CIRCUIT BOARD AND DISPLAY DEVICE

CROSS-REFERENCE TO RELATED APPLICATION

The present disclosure claims priority to Chinese Patent Application No. 202110222523.0 filed in China on Feb. 25, 2021, the entire contents of which are hereby incorporated by reference.

TECHNICAL FIELD

The present disclosure relates to the field in display technology, and particularly relates to a flexible circuit board, a method for manufacturing the flexible circuit board and a display device.

BACKGROUND

In related art, a flexible circuit board of a display device includes adjacent VDD1 signal line and VDD2 signal line, and since the VDD1 signal and the VDD2 signal are a pair of high and low adjacent voltage signals, copper ions in the conductive layer of the pins migrate to cause an undesirable phenomenon of burning down an insulating layer.

SUMMARY

In view of the above, the present disclosure provides a flexible circuit board, a method for manufacturing the flexible circuit board, and a display device.

An embodiment of the present disclosure provides a flexible circuit board including:
  a plurality of driving signal lines, wherein the driving signal lines include at least two voltage signal lines arranged adjacent to each other; and
  at least one isolation protecting line located between the two voltage signal lines arranged adjacent to each other and configured such that when the flexible circuit board is powered on, the isolation protecting line is not electrically connected or the isolation protecting line is grounded.

In an embodiment, no voltage signal is inputted into the isolation protecting line.

In an embodiment, a structure of the voltage signal line is same as that of the isolation protecting line.

In an embodiment, the voltage signal line includes:
  a conductive layer and a flat layer;
  an insulating layer arranged between the conductive layer and the flat layer; and
  an electrode layer arranged at a side of the flat layer distal to the conductive layer.

In an embodiment, a material of the conductive layer includes MoNbCu, a material of the insulating layer includes SiNx, a material of the flat layer includes SiNx, and a material of the electrode layer includes $In_2O_3SnO_2$.

In an embodiment, the isolation protecting line includes:
  a conductive layer and a flat layer;
  an insulating layer arranged between the conductive layer and the flat layer; and
  an electrode layer arranged at a side of the flat layer distal to the conductive layer.

In an embodiment, a material of the conductive layer includes MoNbCu, a material of the insulating layer includes SiNx, a material of the planar layer includes SiNx, and a material of the electrode layer includes $In_2O_3SnO_2$.

In an embodiment, the voltage signal line includes at least two voltage signal pins; and
  the isolation protecting line includes at least one isolation protecting pin.

In an embodiment, the isolation protecting pin is configured such that when the flexible circuit board is electrically connected to an external power source, the isolation protecting pin is not electrically connected or the isolation protecting pin is grounded.

An embodiment of the present disclosure provides a method for manufacturing the flexible circuit board, includes:
  forming a plurality of driving signal lines, wherein the driving signal lines include at least two voltage signal lines arranged adjacent to each other;
  forming the isolation protecting line between the two voltage signal lines arranged adjacent to each other, wherein the isolation protecting line is configured such that when the flexible circuit board is powered on, the isolation protecting line is not electrically connected or the isolation protecting line is grounded.

In an embodiment, the voltage signal line includes at least two voltage signal pins;
  the isolation protecting line includes at least one isolation protecting pin.

In an embodiment, the voltage signal pin is formed in a same layer as the isolation protecting pin.

An embodiment of the present disclosure provides a display device including a display panel and the flexible circuit board as described above.

DETAILED DESCRIPTION

The embodiments of the present disclosure will now be described more fully hereinafter with reference to the accompanying drawings, in which embodiments of the disclosure are shown. It is to be understood that the embodiments described herein are merely illustrative of some, but not all the embodiments of the disclosure. Based on the embodiments in the present disclosure, all other embodiments obtained by a person of ordinary skill in the art without inventive effort are within the scope of the present disclosure.

Figure 1:
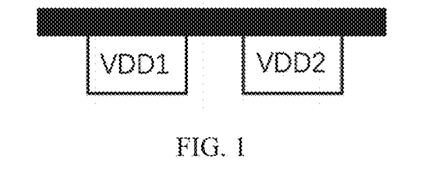
FIG. 1 shows a distribution diagram of the VDD1 signal pin and the VDD2 signal pin according to the related art.
Figure 2:
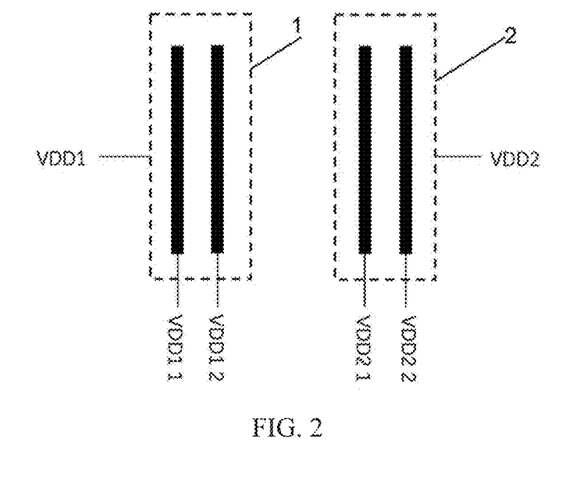
FIG. 2 shows a distribution diagram of the VDD1 signal pin and the VDD2 signal pin according to the related art.

In the related art, the flexible circuit board includes a plurality of voltage signal lines, for example, the flexible circuit board includes a first voltage signal line 1 and a second voltage signal line 2 which are arranged adjacent to each other. As shown in FIG. 1 and FIG. 2, wherein the first voltage signal line 1 outputs a VDD1 signal, the second voltage signal line 2 outputs a VDD2 signal, the first voltage signal line 1 may include two sub-voltage signal lines which respectively output VDD11 and VDD12 signals, and the second voltage signal line 2 may also include two sub-voltage signal lines which respectively output VDD21 and VDD22 signals. Since the VDD1 signal and the VDD2 signal are a pair of adjacent high and low voltage signals, copper ions in a conductive layer of the pin migrate to cause an undesirable burn-out of the insulating layer. In view of the above-mentioned problems, the present disclosure provides a barrier function by providing an isolation protecting line between adjacently arranged voltage signal lines to prevent the migration of copper ions and thus the generation of an undesirable phenomenon that the insulating layer burn-out, and a specific method is as described in the following embodiments.

Figure 3:
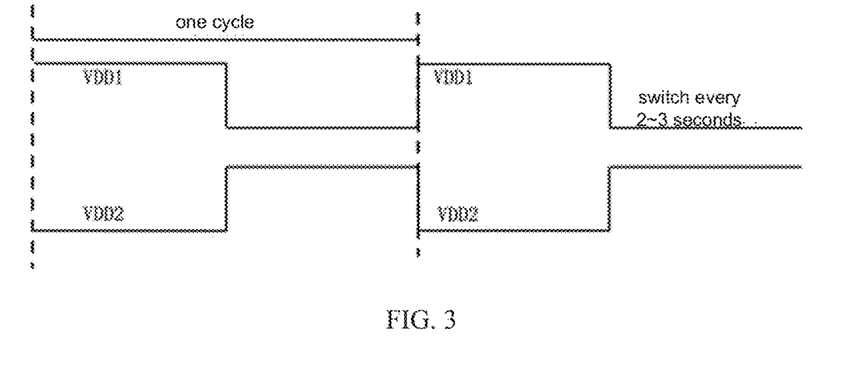
FIG. 3 shows a signal diagram of the VDD1 signal and the VDD2 signal at one frame according to the related art.
Figure 4:
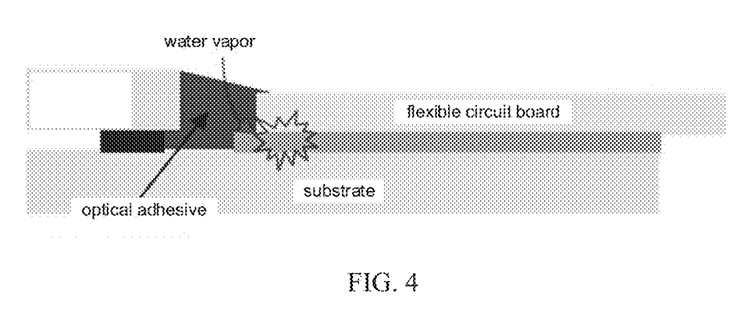
FIG. 4 shows a schematic diagram showing a scenario where water vapor enters the interior the glass of the array substrate according to the related art.
Figure 5:
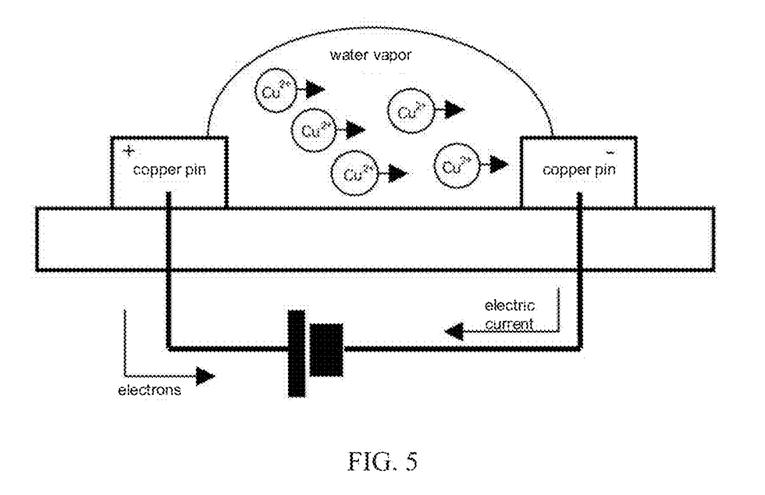
FIG. 5 shows a schematic diagram of electrochemical corrosion of copper ions according to the related art.

In an embodiment of the present disclosure, the inventors of the present disclosure have studied and found that the signal diagram of VDD1 signal and VDD2 signal during one frame time is as shown in FIG. 3, and during the first half period of one cycle time, VDD1 is a high level and VDD2 is a low level; during the second half of a cycle time, VDD2 is high and VDD1 is low. Optionally, the time of one period may be 2 s, 2.5 s, or 3 s, etc. and the present disclosure is not limited to the time of one frame. It can be seen therefrom that VDD1 and VDD2 are a pair of signals with opposite levels, that is to say, VDD1 and VDD2 are a pair of signals with adjacent high and low voltages during operation; since there is a voltage differential signal between the VDD1 signal line and the VDD2 signal line, and water vapor entering easily occurs near the optical adhesive of the flexible circuit board (as shown in FIG. 4), when the water vapor enters the interior of the glass of the array substrate, mass electrolyte is provided near the pin; since a material of chip pin is copper, and there is a voltage difference between the two pins, which exactly satisfy the sufficient and necessary conditions for electrochemical corrosion; and in a high temperature and high humidity environment, electrochemical corrosion is very likely to occur, constituting electrochemical corrosion as shown in FIG. 5, resulting in the pins failing to provide a normal signal to the display panel. Corrosion phenomenon occurs in actual flexible circuit board during use.

To solve the above-mentioned problems, the present disclosure adds the isolation protecting line between adjacently arranged voltage signal lines, and the specific solutions are as described in the following embodiments.

Figure 6:
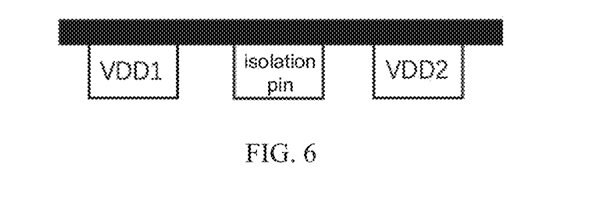
FIG. 6 shows a schematic diagram of chip pin distribution in an embodiment of the present disclosure.
Figure 7:
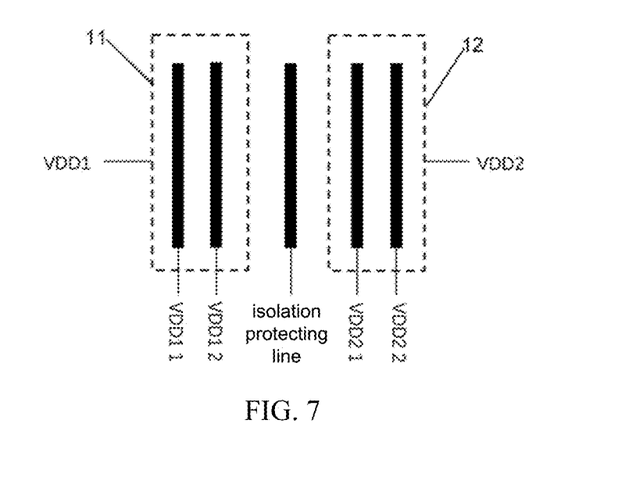
FIG. 7 shows a schematic diagram of chip pin distribution in an embodiment of the present disclosure.

FIG. 6 shows a schematic diagram of chip pin distribution in an embodiment of the present disclosure. FIG. 7 shows a schematic diagram of chip pin distribution in an embodiment of the present disclosure.

With reference to FIG. 6 and FIG. 7, the flexible circuit board includes a plurality of driving signal lines arranged with mutually insulate-gates, wherein the plurality of driving signal lines arranged with mutually insulate-gates may include: a voltage signal line and a clock signal line, etc. The plurality of driving signal lines arranged with mutually insulate-gates include at least two voltage signal lines arranged adjacent to each other; specifically, as shown in FIG. 7, the voltage signal line 11 may include two sub-voltage signal lines outputting VDD11 and VDD12 signals respectively, and the voltage signal line 12 may also include two voltage signal lines outputting VDD21 and VDD22 signals respectively. In addition to a plurality of voltage signal lines, the flexible circuit board further includes at least one isolation protecting line, wherein each of the isolation protecting lines is arranged between adjacent voltage signal lines, and the isolation protecting line is a passive signal line; it can be understood that the isolation protecting line merely plays the role of isolation protecting between adjacent voltage signal lines so as to prevent the electromigration of copper ions in the adjacent voltage signal lines; in addition, the isolation protecting line does not affect the normal function of the flexible circuit board.

In an embodiment of the present disclosure, the isolation protecting line does not convey a voltage signal, and therefore the isolation protecting line itself can't have a level, and the normal function of the flexible circuit board is not affected, and therefore the isolation protecting line can be made to merely function as isolation protecting, preventing copper ions of adjacent voltage signal lines from migrating and thus causing the generation of an undesirable phenomenon of insulating layer burn-out.

In an embodiment of the present disclosure, the isolation protecting line is the passive line, and the passive line can be arranged in such a way that: when the flexible circuit board is electrically connected to an external power source, the isolation protecting line is arranged not to be electrically connected to the external power source, or the isolation protecting line is grounded. Arranging the isolation protecting line not to be electrically connected to the external power source or to be grounded enables the isolation protecting line itself not to have the level, and does not affect the normal function of the flexible circuit board, and therefore, the isolation protecting line can only serve as a barrier to prevent copper ions from migrating and thus causing the generation of the undesirable phenomenon of insulating layer burn-out.

In an embodiment of the present disclosure, optionally, the flexible circuit board includes two voltage signal lines, respectively the first voltage signal line and the second voltage signal line, wherein the first voltage signal line is connected to the first voltage signal pin and the second voltage signal line is connected to the second voltage signal pin. The first voltage signal line and the second voltage signal line are a pair of signals with opposite levels, that is to say, the first voltage signal line and the second voltage signal line are a pair of signals with adjacent high and low voltages during operation, and the voltage differential signal is provided between the first voltage signal pin and the second voltage signal pin. The flexible circuit board further includes the isolation protecting line located between the first voltage signal line and the second voltage signal line. The isolation protecting line is a passive signal line, and it can be understood that the isolating protecting line merely plays the role of isolation protecting between adjacent voltage signal lines so as to prevent the electromigration of copper ions in the adjacent voltage signal lines; in addition, the isolation protecting line does not affect the normal function of the flexible circuit board. The arrangement of the isolation protecting line can play the role of isolation protecting between the first voltage signal line and the second voltage signal line, and prevent the migration of metallic copper ions in the first voltage signal line and the second voltage signal line so as to avoid causing the phenomenon of the insulating layer burn-out.

Figure 8:
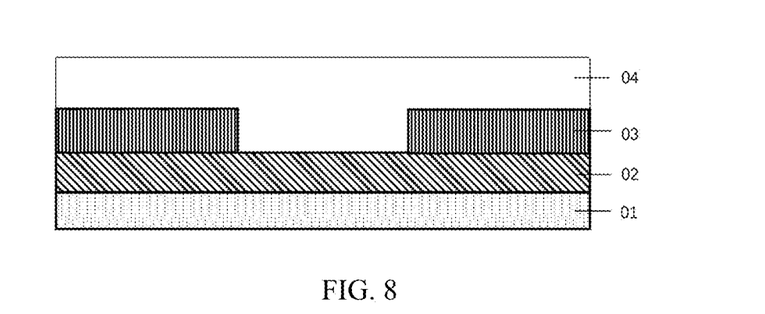
FIG. 8 shows a schematic diagram of an isolation protecting line structure in an embodiment of the present disclosure.

In an embodiment of the present disclosure, as shown in FIG. 8, a structure of the voltage signal line is same as that of the isolation protecting line. The structure of the isolation protecting line includes the conductive layer 01 and a flat layer 03; the insulating layer 02 is arranged between the conductive layer 01 and the flat layer 03; an electrode layer 04 is arranged at a side of the flat layer 03 distal to the conductive layer 01. Likewise, the structure of the voltage signal line may also include the conductive layer 01 and the flat layer 03; the insulating layer 02 is arranged between the conductive layer 01 and the flat layer 03; the electrode layer 04 is arranged at a side of the flat layer 03 distal to the conductive layer 01. The conductive layer 01 of the voltage signal line and the conductive layer 01 of the isolation protecting line can be arranged at the same layer; the insulating layer 02 of the voltage signal line and the insulating layer 02 of the isolation protecting line are arranged at the same layer; the flat layer 03 of the voltage signal line and the flat layer 03 of the isolation protecting line are arranged in the same layer. The electrode layer 04 of the voltage signal line and the electrode layer 04 of the isolation protecting line are arranged in the same layer.

Optionally, a material of the conductive layer 01 of the isolation protecting line includes metal, for example: MoNbCu, etc. In addition, the conductive layer 01 of the isolation protecting line may also be of other materials, and a material of the conductive layer 01 of the isolation protecting line is not limited in the present disclosure.

Optionally, a material of the insulating layer 02 of the isolation protecting line includes SiNx, in addition, the insulating layer 02 of the isolation protecting line may also be made of other materials, and a material of the insulating layer 02 of the isolation protecting line is not limited in the present disclosure.

Optionally, a material of the flat layer 03 of the isolation protecting line includes SiNx, in addition, the flat layer 03 of the isolation protecting line may also be made of other materials, and a material of the flat layer 03 of the isolation protecting line is not limited in the present disclosure.

Optionally, a material of the electrode layer 04 of the isolation protecting line includes $In_2O_3SnO_2$; in addition, the electrode layer 04 of the isolation protecting line may also be of other materials, and a material of the electrode layer 04 of the isolation protecting line is not limited in the present disclosure.

In an embodiment of the present disclosure, the voltage signal lines 11 and 21 include at least two voltage signal pins; the isolation protecting line includes at least one isolation protecting pin. The isolation protecting pin is a virtual pin, and the method for arranging the virtual pin can be: when the flexible circuit board is electrically connected to the external power source, the isolation protecting pin is arranged not to be electrically connected to the external power source, or the isolation protecting pin is grounded. Arranging the isolation protecting pin not to be electrically connected to the external power source or to be grounded enables the isolation protecting pin itself not to have a level, and does not affect the normal function of the flexible circuit board; therefore, the isolation protecting pin can merely serve as a barrier to prevent copper ions from migrating and thus causing the undesirable phenomenon of insulating layer burn-out.

In an embodiment of the present disclosure, the method for manufacturing the flexible circuit board includes: forming a plurality of driving signal lines arranged with mutually insulate-gates, wherein the driving signal lines include at least two voltage signal lines arranged adjacent to each other; the isolation protecting line is prepared between the two voltage signal lines arranged adjacent to each other. By forming the isolation protecting line between adjacently arranged voltage signal lines, the present disclosure enables the isolation protecting line to function as a barrier, preventing copper ions from migrating and thus causing the undesirable phenomenon of insulating layer burn-out.

In an embodiment of the present disclosure, the voltage signal line includes at least two voltage signal pins; the isolation protecting line includes at least one isolation protecting pin. The method for manufacturing the flexible circuit board further includes: forming at least two voltage signal pins, wherein the voltage signal line is connected to at least two voltage signal pins; manufacturing at least one isolation protecting pin, the isolation protecting line is connected to at least one isolation protecting pin.

Figure 9:
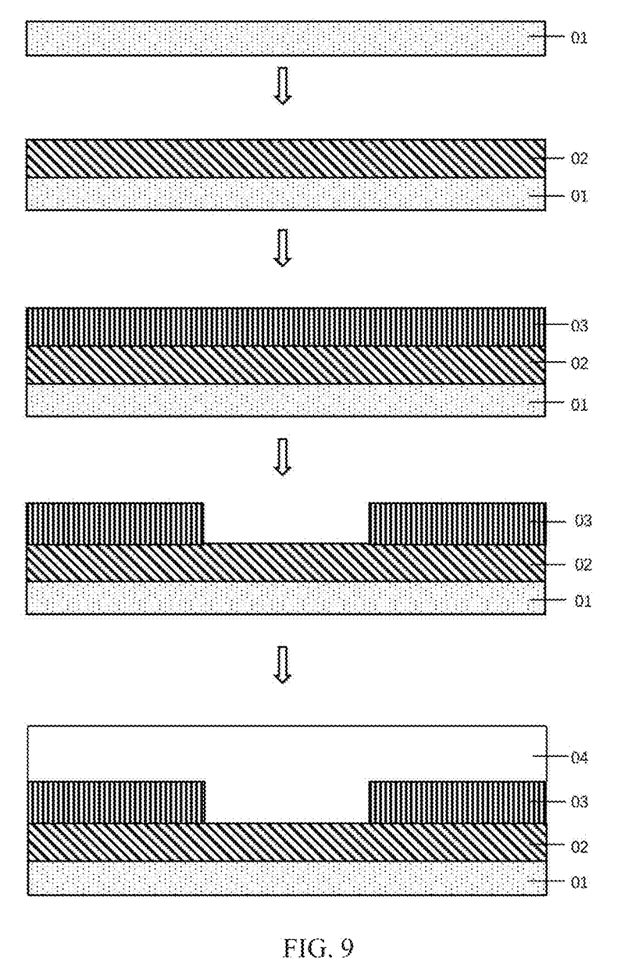
FIG. 9 shows a schematic diagram of the process for manufacturing an isolation protecting line in an embodiment of the present disclosure.

In an embodiment of the present disclosure, the voltage signal line and the isolation protecting line may be formed in the same layer. Optionally, the isolation protecting line may be formed in the same method as the voltage signal line. As shown in FIG. 9, the method for manufacturing the isolation protecting line includes: forming the insulating layer 02 on the conductive layer 01; forming the flat layer 03 on the insulating layer 02, etching the flat layer 03 to form a pattern, and depositing the electrode layer 04 on the flat layer 03. Likewise, the method for manufacturing the voltage signal line includes: forming the insulating layer 02 on the conductive layer 01; forming the flat layer 03 on the insulating layer 02, etching the flat layer 03 to form a pattern, and depositing the electrode layer 04 on the flat layer 03. The conductive layer 01 of the voltage signal line and the conductive layer 01 of the isolation protecting line are the same layer and can be prepared simultaneously; the insulating layer 02 of the voltage signal line and the insulating layer 02 of the isolation protecting line are the same layer and can be prepared simultaneously; the flat layer of the voltage signal line and the flat layer of the isolation protecting line are the same layer and can be prepared simultaneously; the electrode layer 04 of the voltage signal line and the electrode layer 04 of the isolation protecting line are the same layer and can be prepared simultaneously.

In an embodiment of the present disclosure, the flexible circuit board may be packaged using COF (Chip On Flex, or Chip On Film). The COF is a packaging technology of fixing an Integrated Circuit (IC) on the flexible circuit board, and a flexible additional circuit board is used as a packaging chip carrier to combine a chip with a flexible substrate circuit, or refers to the flexible additional circuit board without packaging the chip, including a tape-and-reel packaging production (a TAB substrate, the manufacturing process thereof being referred to as TCP), a flexible board connection chip assembly, and a flexible IC carrier board packaging.

Figure 10:
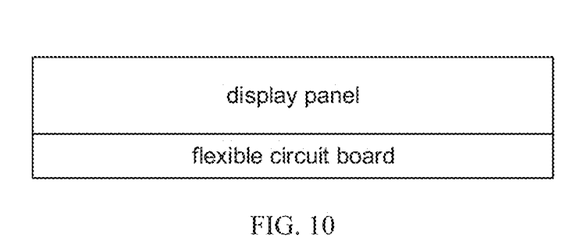
FIG. 10 shows a schematic diagram of a display device in an embodiment of the present disclosure.

In an embodiment of the present disclosure, as shown in FIG. 10, the display device includes the flexible circuit board described in the above-mentioned embodiment, and it can be understood that the display device can be an electronic display device such as a mobile phone or a computer, and the type of the display device is various and optional, the present disclosure does not limit the specific type of the display device.

In an embodiment of the present disclosure, as shown in FIG. 10, the display device further includes a display panel arranged at the flexible circuit board. One end of the isolation protecting pin is not connected to a circuit inside the display panel, the other end of the isolation protecting pin is not electrically connected to the external power source, or the isolation protecting pin is grounded, and it can be understood that the isolation protecting pin is the virtual pin. The isolation protecting pin is arranged at one side of the display panel. By arranging the isolation protecting pin on one side of the display panel, the present disclosure prevents electrochemical corrosion from occurring between adjacent pins due to a voltage difference between adjacent voltage signals when the display panel is normally driven, and migration of copper ions occurs, which causes copper corrosion of the pins, resulting in no voltage signal when the display panel is normally driven, and thus causing the undesirable phenomenon that a defectiveness of the display device occurs.

Although the basic principles of the present disclosure have been described above in connection with specific embodiments, it should be noted that the merits, advantages, and effects. mentioned in the present disclosure are merely examples but not limitations, and these merits, advantages, and effects cannot be considered as necessary for each embodiment of this application. In addition, the specific details disclosed above are for the purpose of illustration and explanation only and are not intended to be limiting. The above details do not limit the present disclosure to the extent that it must be implemented with the above specific details.

The block diagrams of devices, apparatus, equipment, systems referred to in this application are merely illustrative examples and are not intended to require or imply that the connections, arrangements, configurations must be made in the manner shown in the block diagrams. The devices, apparatus, equipment, systems may be connected, arranged, configured in any manner, as will be appreciated by those skilled in the art.

It is also noted that the components or steps may be disassembled and/or recombined in the apparatus, equipment and method of the present disclosure. Such disassembly and/or recombination should be considered as equivalents to the present disclosure.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the application. Thus, the present disclosure is not intended to be limited to the aspects shown herein but is to be accorded the widest scope consistent with the principles and novel features disclosed herein.

In the description herein, the meaning of "a plurality" is at least two, e. g., two or three, unless specifically limited otherwise. All directional indications (such as up, down, left, right, front, rear, top, bottom) in the embodiments of the present disclosure are only used to explain the relative positional relationship or motion between the components at a particular attitude (as shown in the drawings), and if the particular attitude changes, the directional indication changes accordingly. In addition, the terms "includes" and "including", and any variations thereof, are intended to cover a non-exclusive inclusion. For example, a process, a method, a system, a product, or apparatus that includes a list of steps or elements is not limited to the listed steps or elements but may optionally include additional steps or elements not listed or inherent to such process, method, product, or apparatus.

The embodiments of the present disclosure and various features in the embodiments can be combined with each other without conflict, and the technical solutions formed are all within the scope of the present disclosure. In the drawings, the size and relative sizes of layers and regions may be exaggerated for clarity. Like numbers refer to like elements throughout.

The embodiments of the present disclosure and various features in the embodiments can be combined with each other without conflict, and the technical solutions formed are all within the scope of the present disclosure. In the drawings, the size and relative sizes of layers and regions may be exaggerated for clarity. Like numbers refer to like elements throughout. It will be understood that, although the terms such as first, second, and third may be used to describe various elements, components, regions, layers and/or sections, these elements, components, regions, layers and/or sections should not be limited by these terms. These terms are only used to distinguish one element, component, region, layer or section from another element, component, region, layer or section. Thus, the first element, component, region, layer or section discussed below could be termed the second element, component, region, layer or section without departing from the teachings of the present disclosure. It will be understood that spatial relationship terms such as "above", "below", and the like, may be used herein for ease of description to describe one element or feature's relationship to other elements or features illustrated in the figures. It will be understood that the spatially relative terms are intended to include different orientations of the device in use and operation in addition to the orientation illustrated in the figures. For example, if the device in the figures is turned over, elements or features described as "under" other elements would then be oriented "above" the other elements or features. Thus, the exemplary terms "under" and "below" can include both an orientation of above and below. The device may be otherwise oriented (rotated 90 degrees or otherwise) and the spatial descriptors used herein interpreted accordingly.

Embodiments of the present disclosure are described herein with reference to cross-sectional views that are schematic illustrations of idealized embodiments (and intermediate structures) of the present disclosure. As such, variations from the shapes shown can be expected due to, for example, manufacturing techniques and/or tolerances. Thus, embodiments of the present disclosure should not be limited to the particular shapes of regions shown herein, but include deviations in shapes due to, for example, manufacturing.

In the above description, detailed structures and steps are set forth in order to provide a thorough understanding of the present disclosure. The preferred embodiments of the present disclosure are described in detail above, however, the present disclosure may include other embodiments in addition to those described in detail.

In addition, reference herein to "embodiment" means that a particular feature, structure, or characteristic described in connection with the embodiment may be included in at least one embodiment of the present disclosure. The appearances of the phrase in various places in the specification are not necessarily all referring to the same embodiment, nor are separate or alternative embodiments mutually exclusive of other embodiments. It is to be expressly and implicitly understood by one of ordinary skill in the art that the embodiments described herein may be combined with other embodiments.

The above is only the specific embodiment of this disclosure, but the protection scope of this disclosure is not limited to this. Any person skilled in the art and familiar with this technical field can easily think of changes or substitutions within the technical scope disclosed in this disclosure, which should be covered within the protection scope of this disclosure. Accordingly, the protection scope herein is as set forth in the attached claims. While the above is directed to the preferred embodiment of the present disclosure, it will be understood by those skilled in the art that various changes in form and details may be made therein without departing from the spirit and scope of the invention. While the above is directed to the preferred embodiment of the present disclosure, it will be understood by those skilled in the art that various changes in form and details may be made therein without departing from the spirit and scope of the invention.

While the foregoing is directed to the preferred embodiment of the present disclosure, it will be understood by those skilled in the art that various changes in form and details may be made therein without departing from the spirit and scope of the invention.

What is claimed is:

1. A flexible circuit board, comprising:
    a plurality of driving signal lines arranged with mutually insulate-gates, wherein the driving signal lines comprise at least two voltage signal lines arranged adjacent to each other; and
    at least one isolation protecting line located between two voltage signal lines among the at least two voltage signal lines arranged adjacent to each other and configured such that when the flexible circuit board is powered on, an isolation protecting line among the at least one isolation protecting line is not electrically connected or the isolation protecting line is grounded; and
    a structure of each voltage signal line is same as that of the isolation protecting line;
    wherein the voltage signal line comprises:
    a conductive layer and a flat layer;
    an insulating layer arranged between the conductive layer and the flat layer; and
    an electrode layer arranged at a side of the flat layer distal to the conductive layer.

2. The flexible circuit board according to claim 1, wherein no voltage signal is inputted into the isolation protecting line.

3. The flexible circuit board according to claim 1, wherein a material of the conductive layer comprises MoNbCu, a material of the insulating layer comprises SiNx, a material of the flat layer comprises SiNx, and a material of the electrode layer comprises $In_2O_3SnO_2$.

4. The flexible circuit board according to claim 1, wherein the isolation protecting line comprises:
    a conductive layer and a flat layer;
    an insulating layer arranged between the conductive layer and the flat layer; and
    an electrode layer arranged at a side of the flat layer distal to the conductive layer.

5. The flexible circuit board according to claim 4, wherein a material of the conductive layer comprises MoNbCu, a material of the insulating layer comprises SiNx, a material of the flat layer comprises SiNx, and a material of the electrode layer comprises $In_2O_3SnO_2$.

6. The flexible circuit board according to claim 1, wherein the voltage signal line comprises at least two voltage signal pins; and
    the isolation protecting line comprises at least one isolation protecting pin.

7. The flexible circuit board according to claim 6, wherein the isolation protecting pin is configured such that when the flexible circuit board is electrically connected to an external power source, the isolation protecting pin is not electrically connected or the isolation protecting pin is grounded.

8. A method for manufacturing the flexible circuit board, comprising:
    forming a plurality of driving signal lines arranged with mutually insulate-gates, wherein the driving signal lines comprise at least two voltage signal lines arranged adjacent to each other;
    forming an isolation protecting line between two voltage signal lines among the at least two voltage signal lines arranged adjacent to each other, wherein the isolation protecting line is configured such that when the flexible circuit board is powered on, the isolation protecting line is not electrically connected or the isolation protecting line is grounded;
    each voltage signal line comprises at least two voltage signal pins; the isolation protecting line comprises at least one isolation protecting pin; and
    the at least two voltage signal pins are formed in a same layer as the at least one isolation protecting pin;
    wherein the voltage signal line comprises:
    a conductive layer and a flat layer;
    an insulating layer arranged between the conductive layer and the flat layer; and
    an electrode layer arranged at a side of the flat layer distal to the conductive layer.

9. A display device comprising a display panel and a flexible circuit board, wherein the flexible circuit board comprises:
    a plurality of driving signal lines arranged with mutually insulate-gates, wherein the driving signal lines comprise at least two voltage signal lines arranged adjacent to each other; and
    at least one isolation protecting line located between two voltage signal lines among the at least two voltage signal lines arranged adjacent to each other and configured such that when the flexible circuit board is powered on, an isolation protecting line among the at least one isolation protecting line is not electrically connected or the isolation protecting line is grounded; and
    a structure of each voltage signal line is same as that of the isolation protecting line;
    wherein the voltage signal line comprises:
    a conductive layer and a flat layer;
    an insulating layer arranged between the conductive layer and the flat layer; and
    an electrode layer arranged at a side of the flat layer distal to the conductive layer.

10. The display device according to claim 9, wherein no voltage signal is inputted into the isolation protecting line.

11. The display device according to claim 9, wherein a material of the conductive layer comprises MoNbCu, a material of the insulating layer comprises SiNx, a material of the flat layer comprises SiNx, and a material of the electrode layer comprises $In_2O_3SnO_2$.

12. The display device according to claim 9, wherein the isolation protecting line comprises:
    a conductive layer and a flat layer;
    an insulating layer arranged between the conductive layer and the flat layer; and
    an electrode layer arranged at a side of the flat layer distal to the conductive layer.

13. The display device according to claim 12, wherein a material of the conductive layer comprises MoNbCu, a material of the insulating layer comprises SiNx, a material of the flat layer comprises SiNx, and a material of the electrode layer comprises $In_2O_3SnO_2$.

14. The display device according to claim 9, wherein the voltage signal line comprises at least two voltage signal pins;

the isolation protecting line comprises at least one isolation protecting pin.

* * * * *